US009087170B2

(12) United States Patent
Hsu et al.

(10) Patent No.: US 9,087,170 B2
(45) Date of Patent: Jul. 21, 2015

(54) CELL LAYOUT DESIGN AND METHOD

(71) Applicant: Taiwan Semiconductor Manufacturing Co., Ltd., Hsin-Chu (TW)

(72) Inventors: Chin-Hsiung Hsu, Guanyin Township (TW); Yuan-Te Hou, Hsinchu (TW); Li-Chun Tien, Tainan (TW); Hui-Zhong Zhuang, Kaohsiung (TW); Fang-Yu Fan, Hukou Township (TW); Wen-Hao Chen, Hsin-Chu (TW); Ting Yu Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/011,790

(22) Filed: Aug. 28, 2013

(65) Prior Publication Data

US 2015/0067616 A1    Mar. 5, 2015

(51) Int. Cl.
*G06F 17/50*        (2006.01)

(52) U.S. Cl.
CPC .................................. *G06F 17/5072* (2013.01)

(58) Field of Classification Search
CPC .................................................... G06F 17/5072
USPC .......................... 320/110–111, 119, 124–125
See application file for complete search history.

(56) References Cited

U.S. PATENT DOCUMENTS

| 2005/0076319 | A1* | 4/2005 | Chow et al. ...................... 716/10 |
| 2005/0166164 | A1* | 7/2005 | Ren et al. ........................... 716/2 |
| 2006/0030138 | A1* | 2/2006 | Konishi ......................... 438/599 |
| 2008/0178135 | A1* | 7/2008 | Wu et al. ............................ 716/8 |
| 2010/0199252 | A1* | 8/2010 | Torvi et al. ...................... 716/12 |
| 2011/0111330 | A1* | 5/2011 | Schultz et al. .................... 430/5 |
| 2013/0334613 | A1* | 12/2013 | Moroz ........................... 257/401 |
| 2014/0019931 | A1* | 1/2014 | Mccullen et al. ............. 716/122 |

* cited by examiner

*Primary Examiner* — Paul Dinh
(74) *Attorney, Agent, or Firm* — Duane Morris LLP

(57) ABSTRACT

A method includes comparing one or more cells to a selection guideline and storing the cells that meet the selection guideline in a non-transient computer readable storage medium to create the cell library based on the comparing. The selection guideline identifies a suitable position of a boundary pin within a cell.

20 Claims, 11 Drawing Sheets

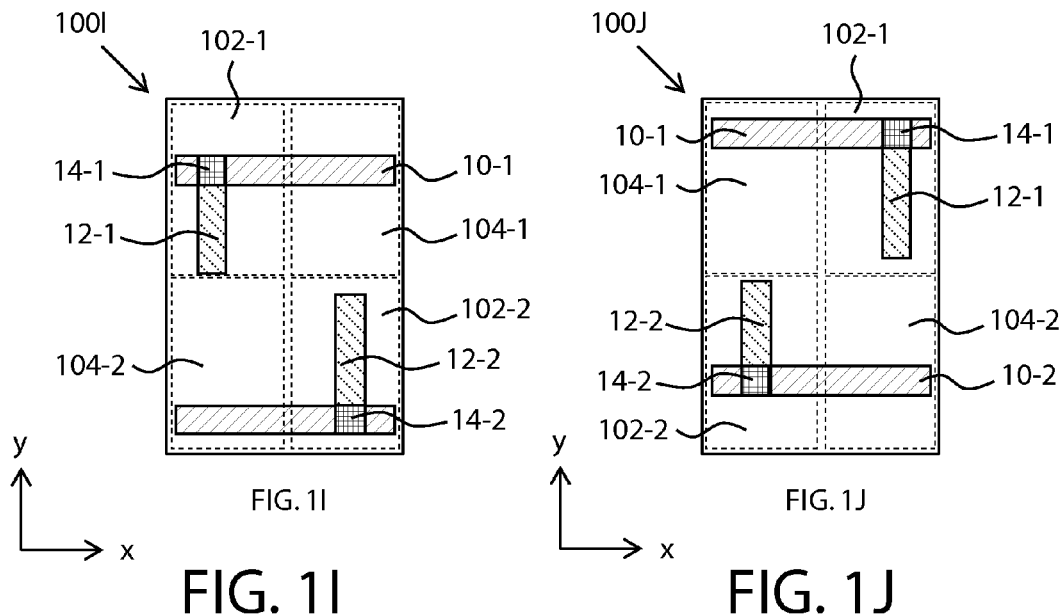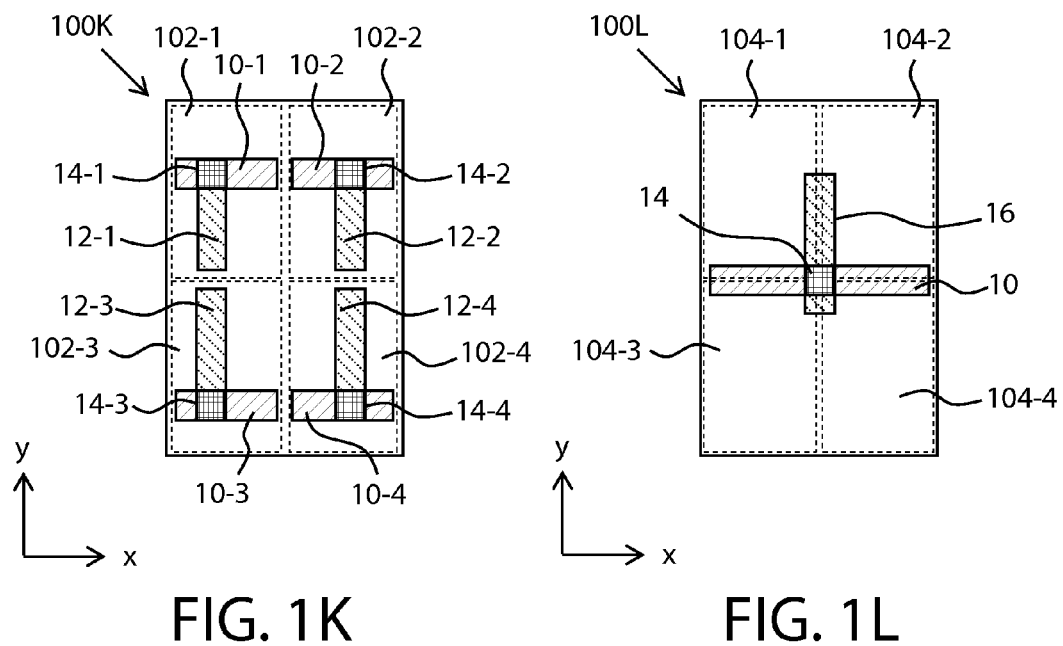

CELL LAYOUT DESIGN AND METHOD

FIELD OF DISCLOSURE

The disclosed system, method, storage medium, relate to integrated circuit fabrication. More particularly, the disclosed system, method, and storage medium relate to cell layouts for use in integrated circuit fabrication.

BACKGROUND

Integrated circuit design is the process through which the electrical components of a circuit are designed, simulated, and stored such that the integrated circuit can be formed on a semiconductor substrate. Application-specific integrated circuits ("ASICs") are typically designed using a standard cell (or "cell") methodology in which standard cells are developed having a particular length and width. Each cell can have a different configuration such that the cell performs a certain function, e.g., a buffer, a latch, or a logic function (e.g., AND, OR, etc.). These cells are placed to form a layout according to certain design rules, which include manufacturing constraints that set forth specific spacing between adjacent cells and/or pins for input/output ("I/O") and power.

DETAILED DESCRIPTION

This description of the exemplary embodiments is intended to be read in connection with the accompanying drawings, which are to be considered part of the entire written description.

The disclosed cell layout design and placement algorithm advantageously enable the cell layout area to be reduced while relaxing cell-abutment constraints. Additionally, the layout design and placement algorithm improves the quality of layouts performed by automatic place and route ("APR") systems.

Figure 1A:
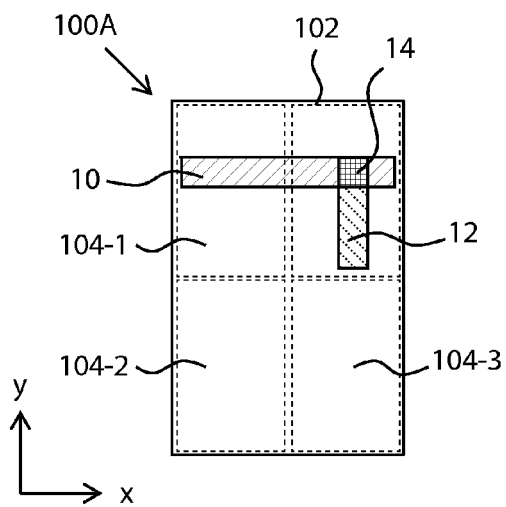
FIGS. 1A-1P illustrate examples of different layouts of a cell divided into quadrants wherein each quadrant is identified by whether it includes a boundary pin in accordance with some embodiments.

FIG. 1A is a simplified layout view of one example of a standard cell 100A. As will be understood by one of ordinary skill in the art, a standard cell includes a group of transistor and interconnect structures for performing a specific function. In addition to the transistor(s) and interconnect structure (s), a cell 100A can include an area 102 in which a boundary signal pin 12, which identifies the existence of a boundary, is disposed. As shown in FIG. 1A, cell 100 can include conductive lines or traces 10 formed in a metal layer (e.g., M1, M2, M3, etc.) for routing power and other signals and vias 14 for connecting metal traces in different layers and/or to be coupled to a power supply rail. Cell 100A is shown as being divided into four areas (quadrants) with lateral boundary area 102 including a boundary signal pin 12 and being positioned in the upper right quadrant of cell 100A, and boundary areas 104-1, 104-2, 104-3 do not include a boundary signal pin.

Figure 1B:
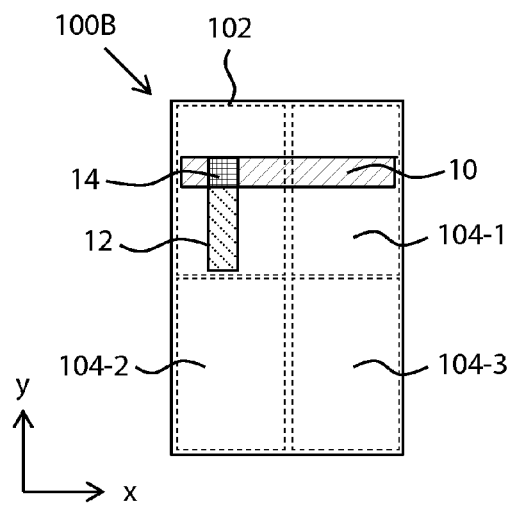
Figure 1C:
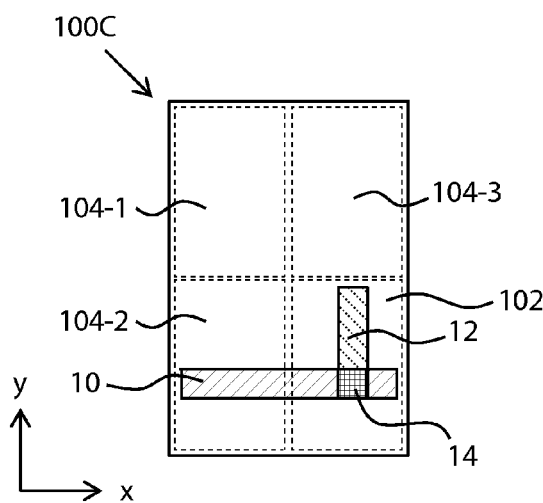
Figure 1D:
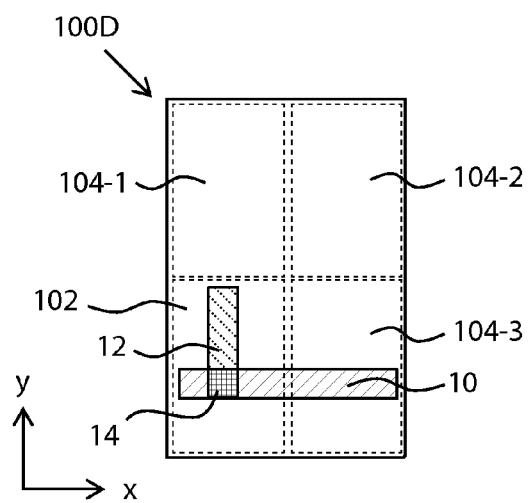

The position of the boundary signal pin 12, and thus the area 102 including boundary signal pin 12, can vary. For example, FIG. 1B illustrates an example of a cell 100B in which boundary area 102 includes a boundary signal pin 12 and is disposed in the upper left quadrant of the cell. FIG. 1C illustrates an example of a cell 100C in which boundary area 102, which includes a boundary signal pin 12, is disposed in the lower right quadrant of the cell, and FIG. 1D illustrates an example of a cell 100D in which area 102 includes a boundary signal pin 14 and is disposed in the lower left quadrant of the cell.

Figure 1E:
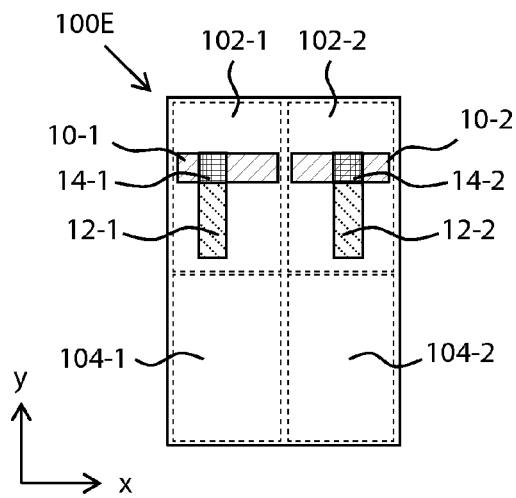
Figure 1F:
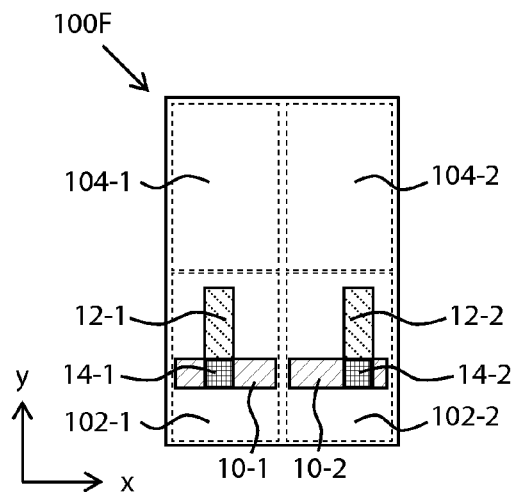

The number of boundary signal pins 12 in a cell can also vary. For example, FIG. 1E illustrates one example of a cell 100E including two pins 12-1, 12-2. As shown in FIG. 1E, boundary signal pins 12-1, 12-2 are located in areas 102-1, 102-2, respectively, which are both located at the upper half of cell 100E. FIG. 1F illustrates an example of a cell 100F in which areas 102-1, 102-1, which each include a respective pin 12-1, 12-2, are located at the bottom half of the cell.

Figure 1G:
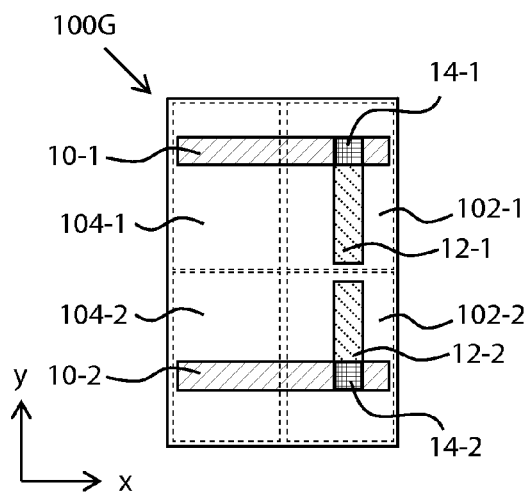
Figure 1H:
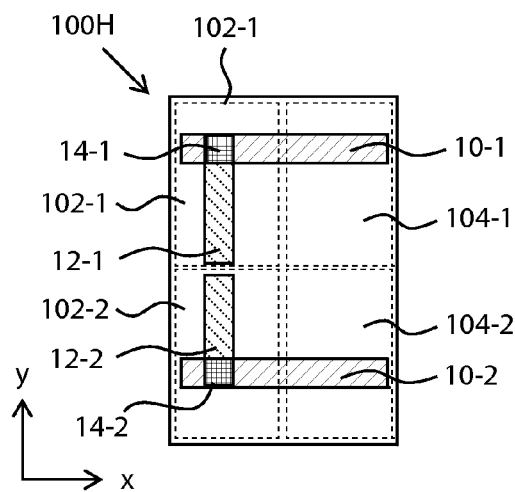

FIGS. 1G and 1H illustrate cells 100G, 100H, respectively, having other layouts. Referring first to FIG. 1G, cell 100G includes boundary signal pins 12-1, 12-2 that are vertically aligned (i.e., in the y-direction) with one another in respective boundary areas 102-1, 102-2. Areas 102-1 and 102-2 are disposed along the right side of the cell 100G. In FIG. 1H, pins 12-1, 12-2 are disposed in areas 102-1, 102-2, respectively, which are for routing different signals than boundary signals and are disposed adjacent to the right-side boundary of cell 100H.

FIGS. 1I and 1J illustrate cells 100I, 100J, respectively, each of which includes two boundary signal pins 12-1, 12-2 disposed in a respective boundary area 102-1, 102-2 with these areas not being horizontally (e.g., in the x-direction) or vertically (e.g., in the y-direction) aligned with each other. For example, cell 100I includes boundary area 102-1 located in the upper left quadrant of the cell and boundary area 102-2 in the lower left quadrant of the cell. Area 104-1 does not include a boundary signal pin and is disposed in the upper right quadrant of cell 100I, and area 104-2 also does not include a boundary signal pin an disposed in the lower left quadrant of cell 100I.

Cell 100J illustrated in FIG. 1J also includes boundary areas 102-1 and 102-2 arranged diagonally from one another. Area 102-1 is disposed in the upper right quadrant of cell 100J, and area 102-2 is disposed in the lower left quadrant of cell 100J. Area 104-1 is located in the upper left quadrant of cell 100J, and boundary area 104-2 is located in the lower right quadrant of cell 100J.

FIGS. 1K and 1L illustrate examples of cells 100K, 100L with a boundary signal pin 12 in each quadrant and without a boundary signal pin in each quadrant, respectively. Referring first to FIG. 1K, cell 100K includes areas 102-1, 102-2, 102-3, 102-4 each including a respective boundary signal pin 12-1, 12-2, 12-3, 12-4 disposed therein. Pin 12-1 is coupled to conductive trace 10-1, which extends horizontally across at least a portion of the cell, by via 14-1. Pin 12-2 located in area 102-2 is coupled to conductive trace 10-2 by via 14-2. Pin 12-3 is disposed in area 102-3, which is located vertically below area 102-1 in which pin 12-1 is located. Pin 12-3 is coupled to conductive trace 10-3 by via 14-3, and boundary signal pin 14-4 is disposed within area 102-4 and is coupled to conductive trace 10-4 by via 14-4.

Turning now to FIG. 1L, cell 100L includes areas 104-1, 104-2, 104-3, 104-4 none of which include a boundary signal pin. Although cell 100L does not include a boundary signal pin, it can include horizontally extending conductive traces 10, vertically extending conductive traces 16, and/or vias 14.

Figure 1M:
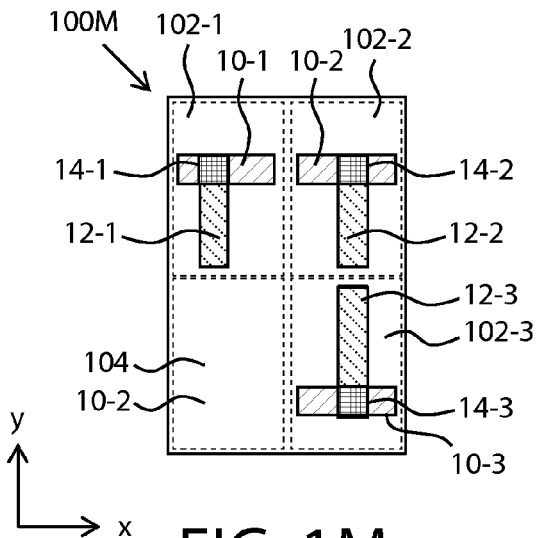
Figure 1N:
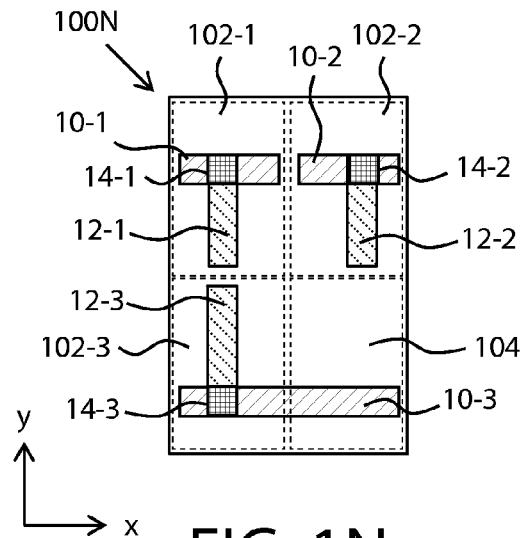
Figure 1O:
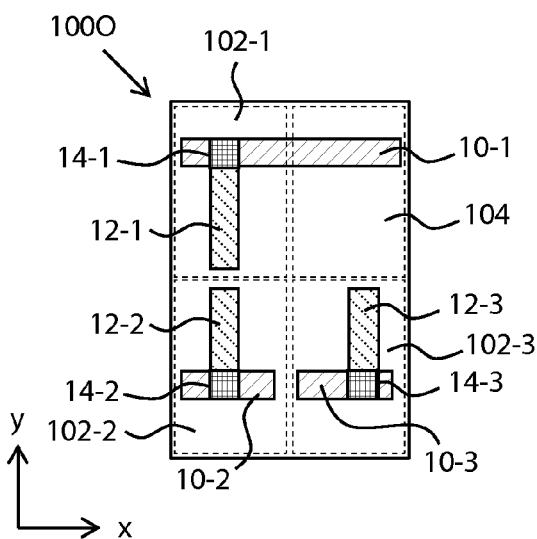

FIGS. 1M-1P illustrate cells including three pins 14. Referring first to FIG. 1M, cell 100I includes boundary areas 102-1, 102-2, and 102-3 each including a respective boundary signal pin 12-1, 12-2, and 12-3. Area 104 does not include a boundary signal pin and is disposed at the bottom left quadrant of cell 100I. Each of the cells 100J, 100K, 100L illustrated in FIGS. 1J-1L, respectively, also include three areas 102-1, 102-2, 102-3 having a respective boundary signal pin 12-1, 12-2, 12-3 disposed therein, and one boundary area 104 without a boundary signal pin. Cell 100J of FIG. 1J is arranged such that area 104 is disposed in the lower right quadrant of the cell, cell 100K of FIG. 1K has an area 104 positioned in the upper left quadrant of the cell, and cell 100L of FIG. 1L is arranged such that area 104 is disposed in the upper right quadrant of the cell.

In accordance with some embodiments, a cell library 432a (FIG. 4) is created with cells meeting certain criteria. To create the cell library, the cells are grouped together by their like attributes. For example, FIG. 2 illustrates one example of cell groupings in which cells 100A-100N are grouped based on their attributes, such as their respective boundary signal pin locations.

Group 202 includes the cells that include two boundary signal pins 12 that are horizontally aligned (i.e., in the x-direction) with one another. Cells 100E and 100F, which are described in greater detail above, meet this criteria and are grouped together in group 202. For example, cell 100E includes a boundary signal pin in the two boundary areas in the upper half of cell 100E (identified by the filled rectangles in FIG. 2), and cell 100F includes a pin in each of the two boundary areas in the lower half of cell 100F (identified by the filled rectangles in FIG. 2). Put another way, cells 100E and 100F include boundary signal pins at both lateral boundaries in the upper half or lower half of the respective cells.

Figure 2:
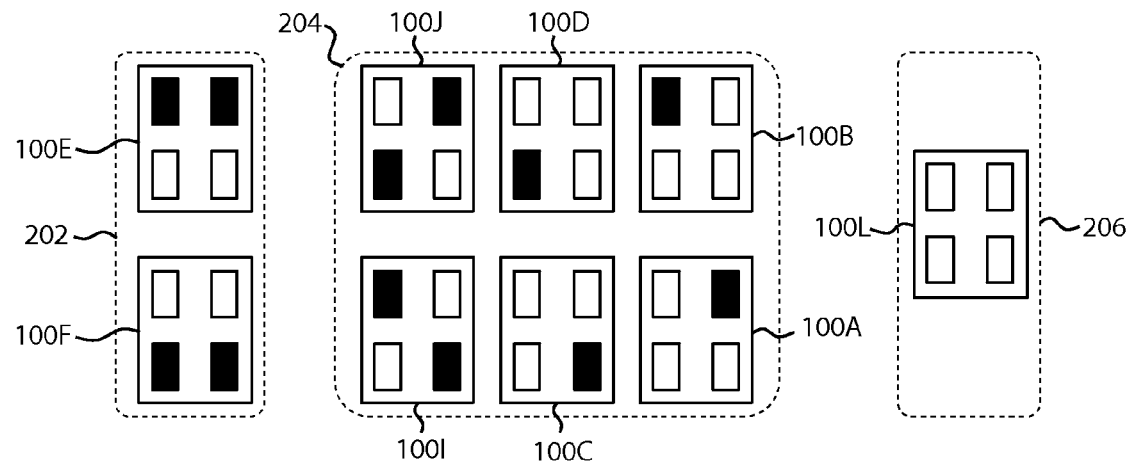
FIG. 2 illustrates one example of grouping the cells illustrated in FIGS. 1A-1P by like attributes in accordance with some embodiments.
Figure 2:
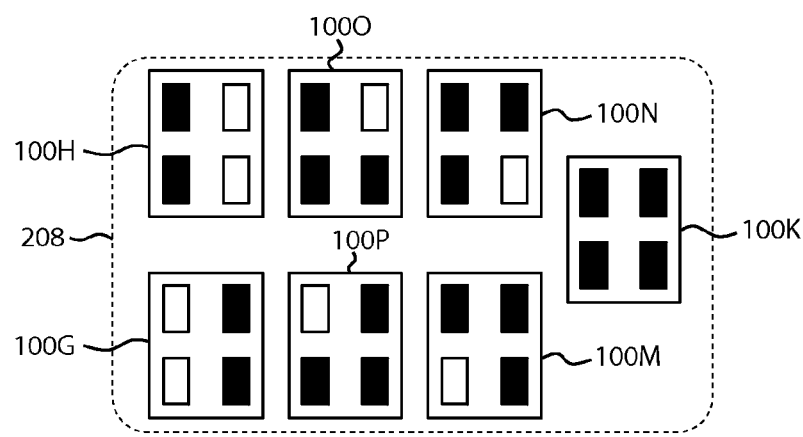

A second group, group 204 in FIG. 2, includes those cells that include at least one boundary signal pin, but do not have any pins horizontally (e.g., in the x-direction) or vertically (e.g., in the y-direction) aligned with one another. Cells 100A, 100B, 100C, 100D, 100I, 100J meet the criteria of group 204. For example, each of cells 100A, 100B, 100C, 100D, 100I, 100J have at least one boundary signal pin disposed adjacent to a lateral boundary of the cell, but these pins are not disposed in horizontal alignment with a pin disposed in another area at a lateral boundary of the cell.

A third group of cells, group 206, includes only one cell meeting the criteria of the group. For example, the cells in the third group are those cells that do not include a signal pin along a lateral boundary, which includes cell 100L. As described above, cell 100L does not include any pins in its boundary areas 104.

The fourth group 208 of cells includes those cells including multiple boundary areas with boundary signal pins that are vertically aligned with one another such that a common lateral boundary (e.g., a left side or right side) includes multiple pins. As shown in FIG. 2, cells 100G, 100H, 100K, 100M, 100N, 100O, and 100P meet the criteria for group 208 as each of these cells includes at least two boundary areas 102 that are aligned vertically with one another.

In some embodiments, the cell library 432a is populated with cells from group 204 and 206 with the cells of groups 202 and 208 not being stored in cell library 432a. The selection of the subset of cells, i.e., the subset of cells comprising groups 204 and 206, is based on a selection guideline. In some embodiments, this selection guideline is determined to ensure that a boundary signal pin access problem (described in greater detail below) can be addressed or solved by flipping of a cell or by replacing a cell with its mirror image, which is included in the subset of cells. The use of the cells of groups 204 and 206 advantageously enables selected cells to be placed close together without incurring an area penalty that would be incurred as will be apparent from the description below.

Figure 3:
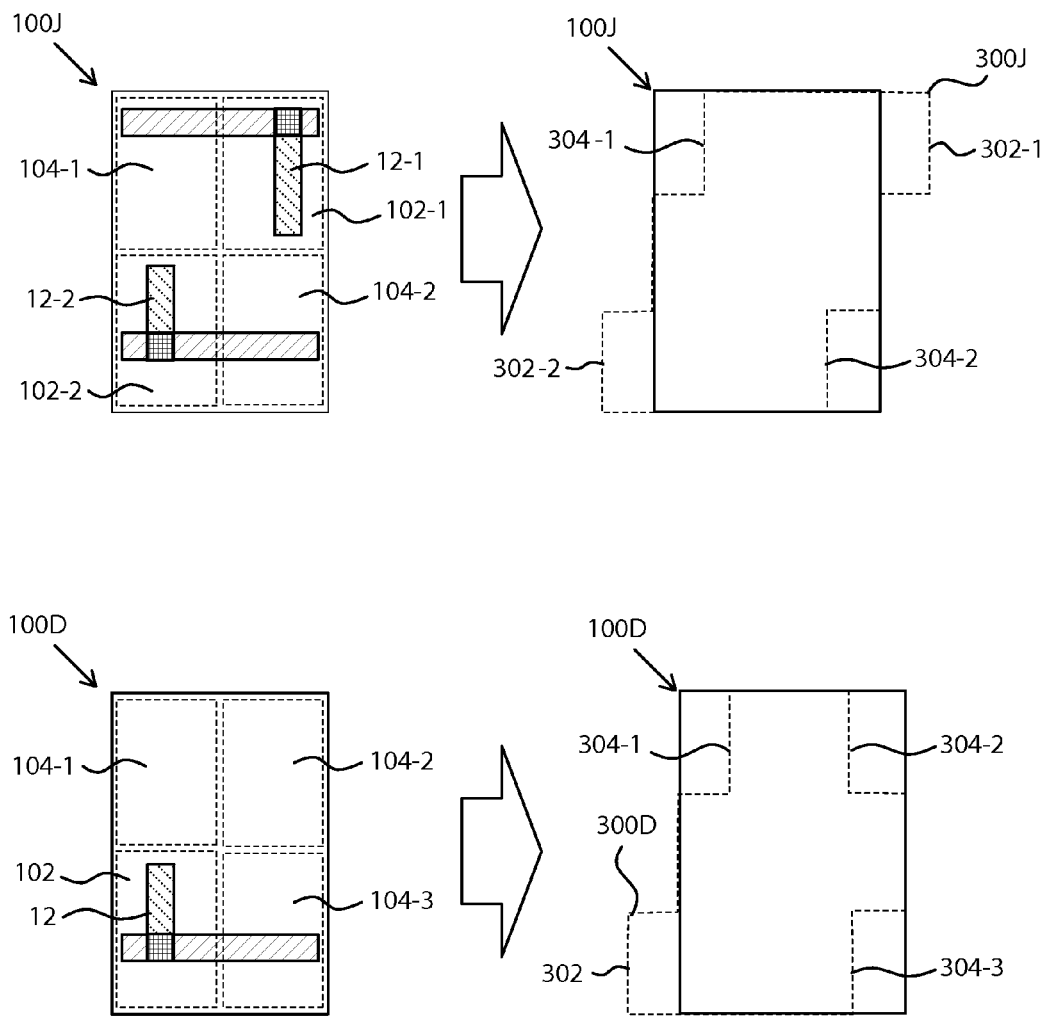
FIG. 3 illustrates examples of markers being added to a layer of cells illustrated in FIGS. 1D and 1J in accordance with some embodiments.

In some embodiments, the cells are stored in cell library 432a with an associated marker for identifying when a boundary rule is violated. For example, FIG. 3 illustrates one example of markers 300J, 300D applied to cells 100J and 100D, respectively. Markers 300J, 300D are aligned with the outer boundaries of their respective cells 100J, 100D except for the corners where markers 300J, 300D identify whether their respective cells 100J, 100D include a pin 12 in the boundary area.

For example, cell 100J includes a pin 12-1 in the upper right quadrant of the cell, and marker 300J includes a section or segment 302-1 that extends beyond the outer boundary of cell 100J. Cell 100J also includes a pin 12-2 in the lower left quadrant, and marker 300J includes another section or segment 302-2 that extends beyond the outer boundary of cell 100J. In the areas 104-1, 104-2 where cell 100J does not include a boundary signal pin, marker 300J includes a respective section or segment 304-1, 304-2 inwardly extending from the outer boundary of cell 100J.

Marker 300D includes three sections or segments 304-1, 304-2, 304-3 that extend inwardly from the outer boundary of cell 100D. The lower left corner of marker 300D includes a section or segment 302 extending beyond the outer boundary of cell 100D to identify that a boundary signal pin 12 is disposed in area 102, which is located in the lower left quadrant of the cell. In this manner, markers 300 can be added to a layer of the cell or otherwise associated with the other cells 100 to be stored in cell library 432a. For example, in some embodiments, markers 300 are added to the place and route ("PR") boundary layer of the cells 100.

Figure 4:
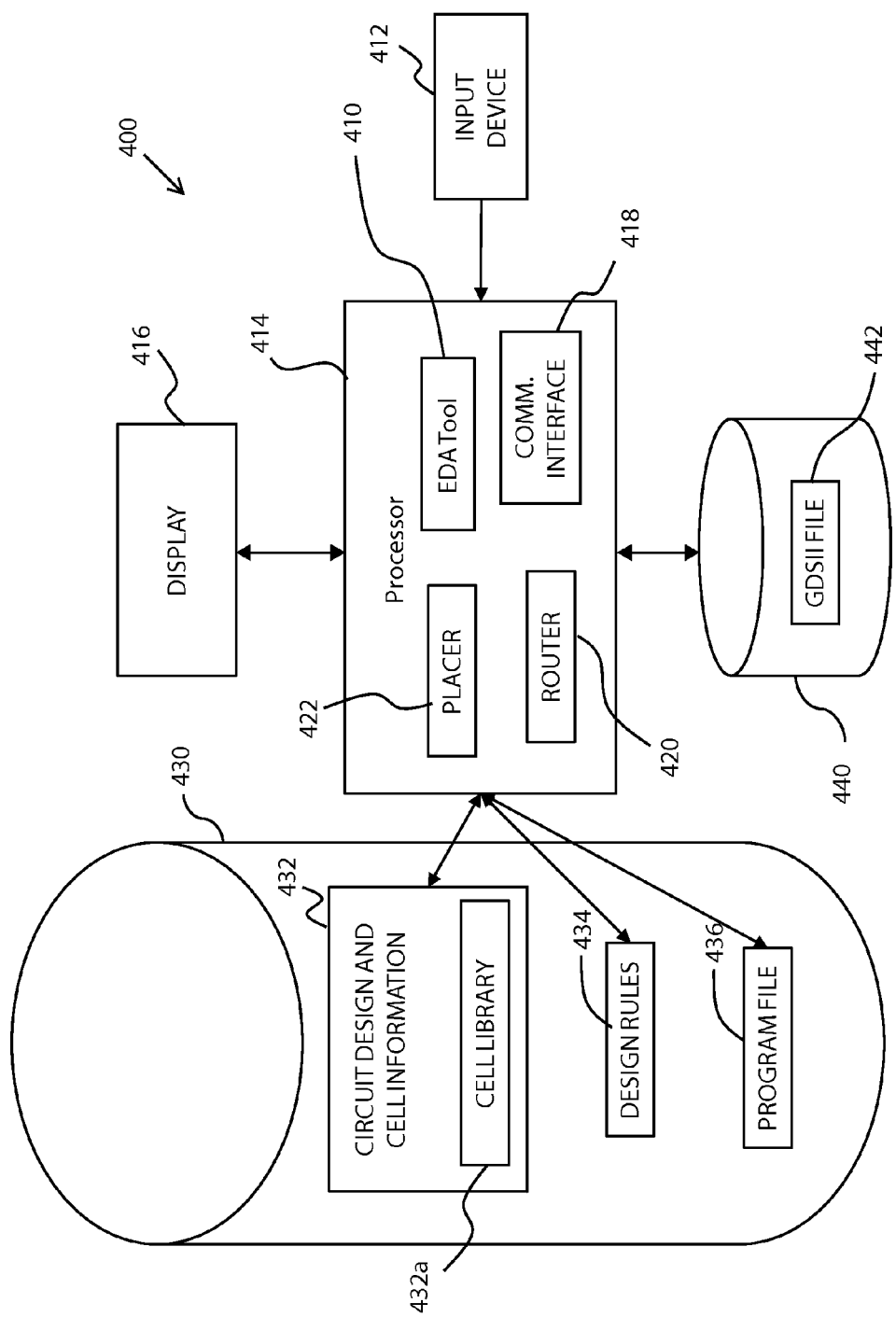
FIG. 4 is a block diagram of one example of a design system in accordance with some embodiments.

With the cell library 432a populated, a designer uses an electronic design automation ("EDA") tool of a design system 400 to create an integrated circuit. FIG. 4 illustrates one example of a system 400 including an EDA tool 410 such as "IC COMPILER"™, sold by Synopsys, Inc. of Mountain View, Calif., having an APR tool including a router 420 such as "ZROUTE"™, also sold by Synopsys. Other EDA tools 410 may be used, such as, for example, the "VIRTUOSO" custom design platform or the Cadence "ENCOUNTER"® digital IC design platform along with the "VIRTUOSO" chip assembly router 420, all sold by Cadence Design Systems, Inc. of San Jose, Calif., and a placer 422.

The EDA tool 410 is a special purpose computer formed by retrieving stored program instructions 436 from a computer readable storage medium 430, 440 and executing the instructions on a general purpose processor 414. Processor 414 may be any central processing unit ("CPU"), microprocessor, micro-controller, or computational device or circuit for executing instructions. The non-transient machine readable storage medium 430, 440 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

In some embodiments, system 400 includes a display 416 and a user interface or input device 412 such as, for example, a mouse, a touch screen, a microphone, a trackball, a keyboard, or other device through which a user may input design and layout instructions to system 400. The one or more computer readable storage mediums 430, 440 store data input by a user such as a circuit design and/or cell information 432 such as, for example, cell library 432a, design rules 434, one or more program files 436, and one or more graphical data system ("GDS") II files 442.

In some embodiments, EDA tool 410 includes a communication interface 418 allowing software and data to be transferred between EDA tool 410 and external devices. Examples of a communications interface 418 include, but are not limited to, a modem, an Ethernet card, a wireless network card, a Personal Computer Memory Card International Association ("PCMCIA") slot and card, or the like. In some embodiments, software and data transferred via communications interface 418 is in the form of signals such as, for example, electronic, electromagnetic, optical, or the like that are capable of being received by communications interface 418. These signals are provided to communications interface 418 via a communications path (e.g., a channel), which, in some embodiments, is implemented using wire, cable, fiber optics, a telephone line, a cellular link, a radio frequency ("RF") link and other communication channels.

Router 420 is capable of receiving an identification of a plurality of cells to be included in a circuit layout, including a list 432 of pairs of cells, selected from the cell library 432a, within the plurality of cells to be connected to each other. Design rules 434 are used for a variety of processing technologies (e.g., technology greater than, less than, or equal to 45 nm). In some embodiments, the design rules 434 configure the router 420 to locate connecting lines and vias on a manufacturing grid. In some embodiments, the router 420 includes off-grid connecting lines and/or vias in the layout.

Figure 5:
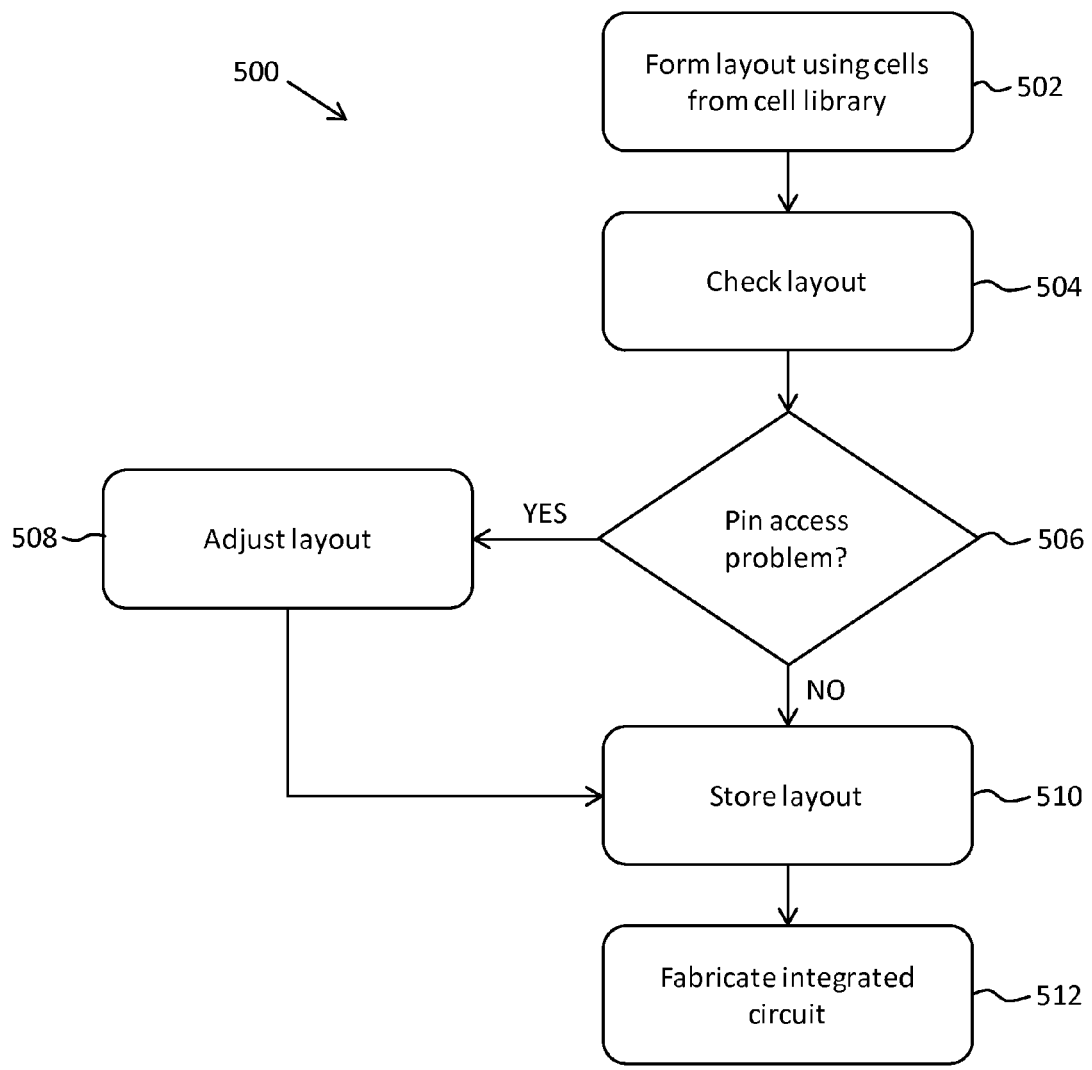
FIG. 5 is a flow diagram of one example of designing a fabricating an integrated circuit in accordance with some embodiments.

A layout of a plurality of cells 100 stored in cell library 432a can be checked by system 400 to determine whether the layout is acceptable based on one or more design rules 434 stored in non-transient machine readable storage medium 430. FIG. 5 is a flow diagram of one example of a method 500 of checking and correcting pin placement issues.

Figure 6A:
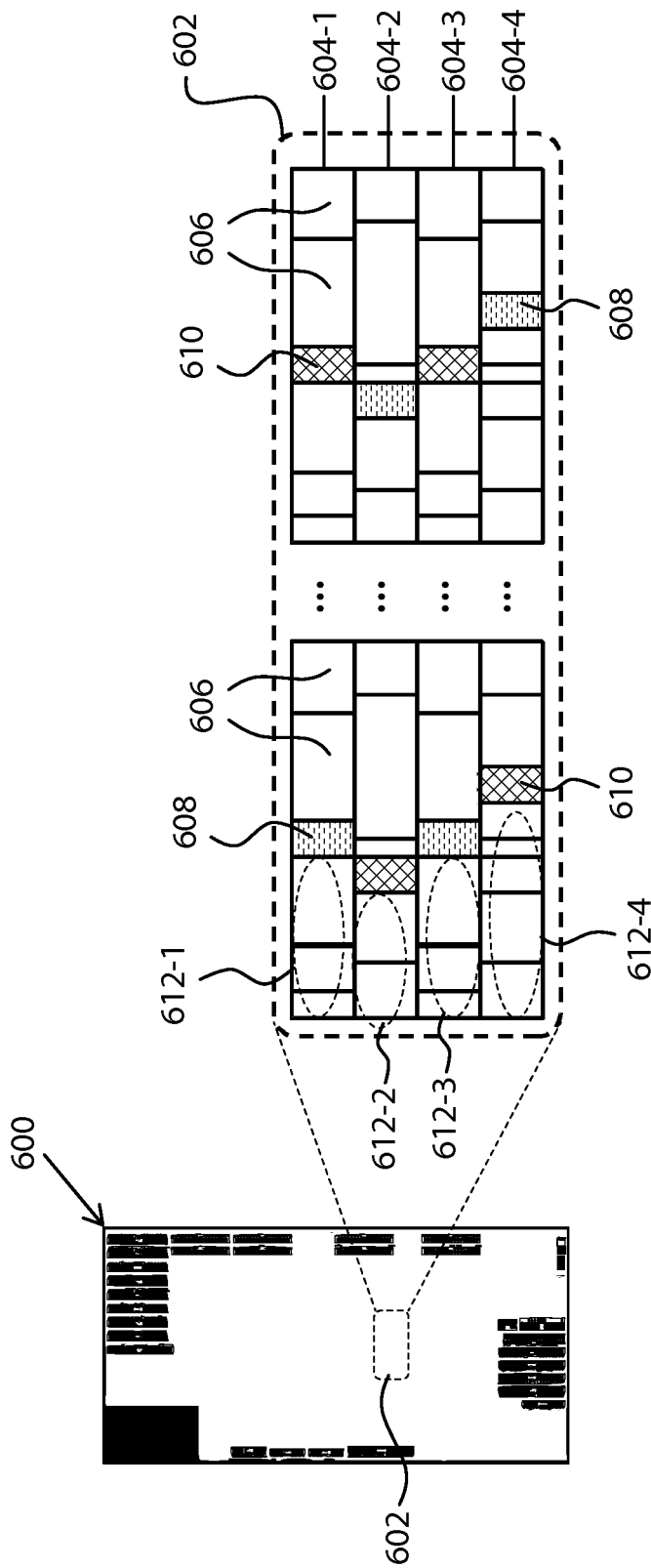
FIG. 6A illustrates one example of an active area of a chip being divided into a plurality of rows including boundary free cells, standard cells, and white space in accordance with some embodiments.

At block 502, cells 100 stored in cell library 432a are placed to form a layout, such as layout of a chip 600 illustrated in FIG. 6A. Chip 600 includes a core area 602, which is shown in the detail view of FIG. 6A. As best seen in the detail view, core area 602 includes a plurality of rows 604-1, 604-2, 604-3, 604-4 ("rows 604"), with each row being divided into a plurality of independent parts. For example, in some embodiments, each row 604 includes a plurality of standard cells 606 having a boundary pin 12 (not shown in FIG. 6A) and one or more boundary-free cells 608 (i.e., cells that do not include a boundary pin) and/or white or vacant spaces 610 (i.e., areas that do not include a standard cell or a boundary-free cell) as shown in FIG. 6A.

Referring again to FIG. 5, the layout is checked for pin access problems at block 504. In some embodiments, design rules 434 identify a minimum spacing between pins for a particular processing technology. Failure to abide by the minimum spacing can result in pins being shorted together or other access issues. In some embodiments, checking for pin access problems is performed by system 400 by analyzing the markers 300 of the cells to determine if any of the markers overlap one another identifying a location where two pins are disposed directly adjacent to another.

In some embodiments, system 400 analyzes the standard cells 606 in each row on a row-by-row basis as illustrated in FIG. 6A. In performing this analysis, system 400 can identify clusters 612 of standard cells 606 and analyze each cluster 612 to determine if pin boundary problems exist, and if so, the best solution based on timing impact and cell adjustments.

Figure 1P:
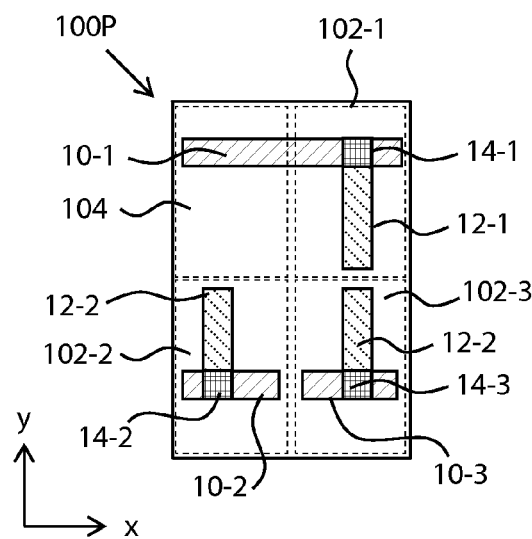
Figure 6B:
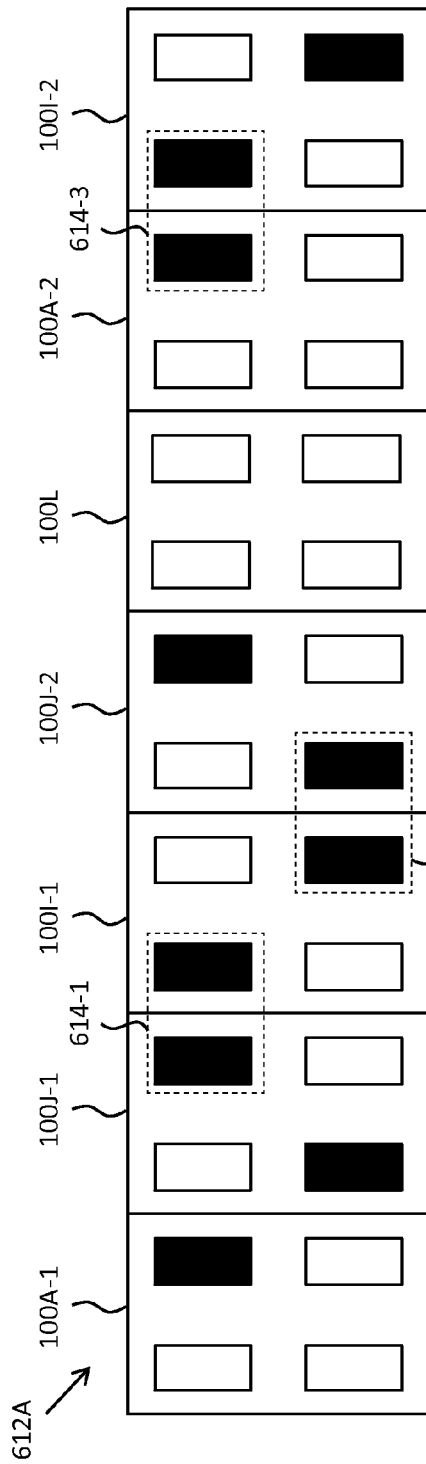
FIG. 6B illustrates one example of a simplified layout in which a plurality of cells from a cell library are arranged in a row in accordance with some embodiments.

For example, FIG. 6B illustrates one example of layout of a first cluster 612A of cells 606 from FIG. 6A, which can be the cells stored in cell library 432a and illustrated in FIGS. 1A-1P described above. Cluster 612A includes three problem areas 614-1, 614-2, and 614-3. Problem area 614-1 is due to cell 100J-1, which includes an area 102-1 having a pin 12-1 disposed in the upper right quadrant of the cell, being positioned directly adjacent to cell 100I-1, which includes an area 102-1 located in the upper left quadrant of the cell such that the pins of these respective cells are directly adjacent to one another. Problem 614-2 is caused by cell 100I-1 and cell 100J-2 being positioned directly adjacent to one another because cell 100I-1 includes a pin in its lower right quadrant and cell 100J-2 includes a boundary signal pin in its lower left quadrant. Cells 100A-2 and 100I-2 being disposed directly adjacent to one another causes problem 614-3 due to cell 100A-2 having a boundary signal pin 12 in its upper right quadrant and cell 100I-2 having a pin in its upper left quadrant.

Referring again to FIG. 5, a decision as to whether the layout includes a problem is made at decision block 506. As described above, a pin access problem is identified when markers 300 of different cells 100 as shown in FIG. 3 overlap one another. If a problem is identified at block 506, then method 500 moves to block 508. If a problem is not identified at block 506, then method 500 moves to block 510.

At block 508, the layout of one or more clusters 612 (FIG. 6A, 6B, 6C) are adjusted to address the problems identified at blocks 504 and 506. In some embodiments, adjusting the layout includes flipping a cell to address the issue based on dynamic programming (or other methods such as linear programming) performed by system 400 to identify an optimal solution to minimize timing impact and/or minimize the number of cell flips. For example, in some embodiments, a dynamic programming algorithm identifies all possible solutions to the pin access problems, which can include adjusting one or more cells of a layout. Once all possible solutions have been identified, the dynamic programming algorithm selects a solution based on a set of criteria. For example, the selected solution can be the fewest number of cell adjustments, the solution that provides the best timing impact, or combinations of these two criteria where fewest number of cell adjustments and timing impact are respectively weighted. In some embodiments, other criteria can be taken into account to identify a solution to a pin access problem using dynamic programming or other method, such as linear programming.

Figure 6C:
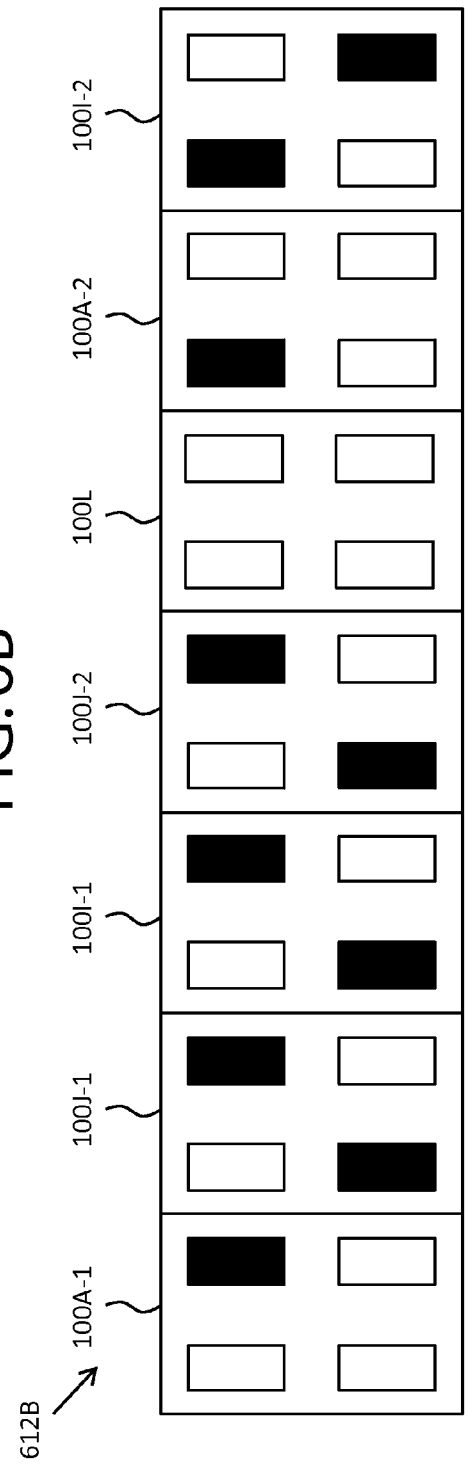
FIG. 6C illustrates one example of a simplified layout in which the layout illustrated in FIG. 6B is modified to avoid pin access problems in accordance with some embodiments.

FIG. 6C illustrates an example of the layout of cluster 612A illustrated in FIG. 6B having been adjusted to address problems 614-1, 614-2, and 614-3. As shown in FIG. 6C, layout of cluster 612B includes cells 100I-1 and 100A-2 that have been flipped to address the problems of FIG. 6B. When a cell is flipped, the cell layout design is not changed. Instead, the layout region corresponding to the flipped cell is flipped (e.g., left side becomes the right side, and vice versa) in each layer. Since each layer is flipped, the cell function is maintained and the interconnect is not affected. In some embodiments, cells could be swapped for one another although the number of cells maintained in cell library 432a could be increased. Once the initial layout of one or more clusters 612A have been adjusted to create a second layout of one more clusters 612B, method 500 moves to block 510.

At block 510, the layout without any boundary signal pin access problems is stored in one or more non-transient machine readable storage mediums 430, 440.

At block 512, an integrated circuit is created based on the layout. As will be understood by one of ordinary skill in the art, creating the integrated circuit includes fabricating one or more photolithography masks ("masks") and using one or more photolithography processes, including one or more single patterning or multi-patterning processes, to form the integrated circuit in a semiconductor substrate.

Figure 7:
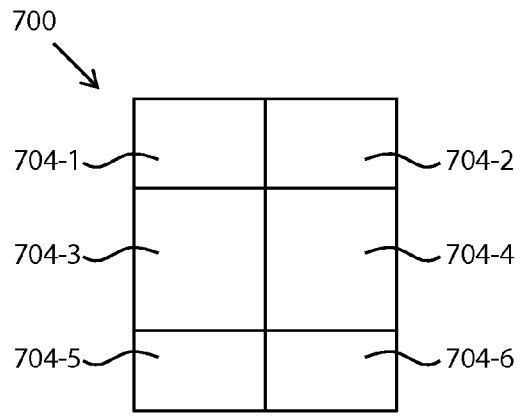
FIG. 7 illustrates one example of a layout of a cell in which the cell is divided into six areas in accordance with some embodiments.
Figure 8:
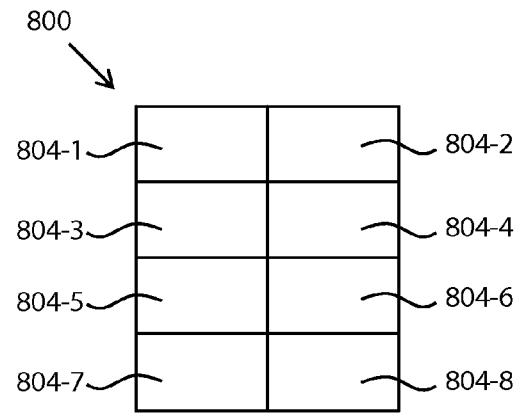
FIG. 8 illustrates one example of a layout of a cell in which the cell is divided into eight areas in accordance with some embodiments.

Although the embodiments have been described above have been done with respect to cells being divided in quadrants, the cells can be further divided. For example, in some embodiments, each lateral boundary of a cell is divided into thirds instead of halves as illustrated in FIGS. 7 and 8. Cell 700 in FIG. 7 is divided into six areas 704 in which each area 704 does not include a boundary signal pin. However, as described above, one or more of areas can include a boundary signal pin. Consequently, whereas there are 16 possible cell arrangements for a cell 100 divided into quadrants ($2^4$=16), there are 64 possible cell arrangements for a cell divided into sixths ($2^6$=64). As shown in FIG. 7, cells can be divided into non-uniform areas where the size of areas 704-3 and 704-3 are larger than the size of areas 704-1, 704-2, 704-5, and 704-6.

Cell 800 in FIG. 8 is divided into eight areas 804 in which each area 804 does not include a boundary signal pin. However, as described above, one or more areas can include a boundary signal pin. Consequently, there are 256 (possible cells arrangements for a cell divided into eighths ($2^8$=256). Like cells 100 described above, the 64 cells 700 of FIG. 7 and 256 cells of FIG. 8 are arranged into groups having like attributes and a select number of the cells are used to populate cell library 432a.

Figure 9:
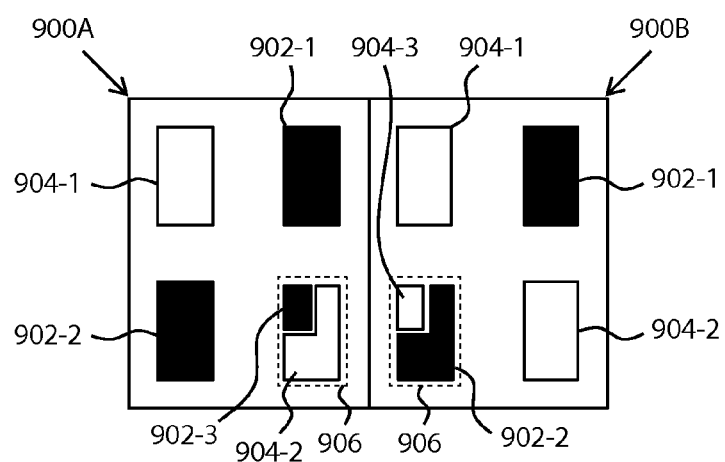
FIG. 9 illustrates one example of a pair of cells in which each cell includes an area that is subdivided in accordance with some embodiments.

FIG. 9 illustrates an example of a pair of cells 900A, 900B yet another arrangement. As shown in FIG. 9, in some embodiments, a quadrant or area is subdivided to accommodate a boundary signal pin 12 while still providing a sufficient spacing when the cell is disposed adjacent to another cell. Cell 900A is divided into four areas 902-1, 902-2, 904, 906. Areas 902-1, 902-2 each include a respective boundary signal pin 12-1, 12-2, and area 904 does not include a pin. Area 906 is subdivided into areas 902-3 and 904-2. Area 902-3 includes a boundary signal pin 12, and area 904-2 does not include a pin.

Cell 900B is also divided into four areas 902-1, 904-1, 904-2, and 906. Area 902-1 is located in the upper right quadrant of cell 900B, cell 904-1 is located in the upper left quadrant, and cell 904-2 is disposed in the lower right quadrant of cell 900B. Cell 906 is subdivided into areas 902-2 and 904-3. Area 902-2 covers approximately ¾ of area 906 extending from the upper right quadrant, to the lower right quadrant, and to the lower left quadrant of area 906. Area 904-3 occupies the upper left quadrant of area 906.

Subdivided cells 906 advantageously enable two cells that would otherwise violate a minimum spacing requirement to be placed directly adjacent to one another by ensuring adequate spacing is provided between the pins (not shown) of area 902-3 of cell 900A and area 902-2 of cell 900B.

The disclosed cell layout designs and placement algorithms described herein advantageously enable the cell layout area to be reduced while relaxing cell-abutment constraints. Additionally, the layout design and placement algorithm improves the quality of layouts performed by automatic place and route APR systems.

In some embodiments, a method includes comparing one or more cells to a selection guideline and storing the cells that meet the selection guideline in a non-transient computer readable storage medium to create the cell library based on the comparing. The selection guideline identifies a suitable position of a boundary pin within a cell.

In some embodiments, a method includes determining if an initial layout of cells includes a pin access problem. The initial layout of cells includes an arrangement of two or more cells selected from the cell library. If the initial layout includes at least one pin access problem, the at least one cell of the first layout is adjusted to produce a second layout that differs from the first layout. One of the initial layout and the second layout is stored as a final layout.

In some embodiments, a method includes fabricating at least one photolithography mask based on the final layout, and fabricating an integrated circuit using the at least one photolithography mask.

In some embodiments, if the initial layout includes a pin access problem, the method includes analyzing the initial layout using dynamic programming to identify a solution to the pin access problem.

In some embodiments, the method includes adding a marker identifying a location of a pin or the absence of a pin to at least one layer of the cell for each of the cells in the subset of cells.

In some embodiments, adjusting at least one cell of the initial layout includes flipping at least one cell of the at least one cell.

In some embodiments, determining if an initial layout of cells includes a pin access problem includes determining if a marker of a first cell overlaps a marker of a second cell.

In some embodiments, the selection guideline identifies a suitable position of a boundary pin within a cell.

In some embodiments, a system includes a non-transient computer readable storage medium, and a processor in signal communication with the non-transient computer readable storage medium. The processor is configured to determine if a first layout of cells includes a pin access; and adjust at least one cell of the first layout to produce a second layout that differs from the first layout if the first layout includes at least one pin access problem. The first layout of cells includes an arrangement of two or more cells selected from a cell library.

In some embodiments, the processor is configured to determine if a cell meets the selection guideline, and store the cell in the cell library in the non-transient computer readable storage medium if the cell meets the selection guideline.

In some embodiments, the processor is configured to add a marker identifying a location of a pin or the absence of a pin to at least one layer of the cell for each cell that meets the selection guideline.

In some embodiments, the processor is configured to flip at least one cell when the processor adjusts at least one cell of the first layout.

In some embodiments, the processor is configured to determine if a marker of a first cell overlaps a marker of a second cell when it determines if a first layout of cells includes a pin access problem.

In some embodiments, the selection guideline identifies a suitable position of a boundary pin within a cell.

In some embodiments, a non-transient computer readable storage medium is encoded with program code. A processor performs a method when the program code is executed by the processor. The method includes creating a cell library to store a number of cells that meet a selection guideline, and determining if a first layout of cells includes a pin access problem. The first layout includes an arrangement of at least two cells selected from the cell library. If the first layout includes at least one pin access problem, then at least one cell of the first layout is adjusted to produce a second layout that differs from the first layout. One of the first layout and the second layout is stored as a final layout.

In some embodiments, the method includes comparing one or more cells against the selection guideline, and determining if the one or more cells meet the selection guideline.

In some embodiments, the method includes adding a marker to identify the presence of a pin in an area or the absence of a pin in an area to at least one layer of the cell for each of the cells that meet the selection guideline.

In some embodiments, the marker includes a portion that extends beyond a boundary of the cell to identifying a location of a pin and includes a portion that extends inwardly from the boundary of the cell to identify the absence of a pin in an area.

In some embodiments, adjusting at least one cell of the first layout includes flipping at least one cell of the at least one cell.

In some embodiments, determining if a first layout of cells includes a pin access problem includes determining if a marker of a first cell overlaps a marker of a second cell.

In some embodiments, the selection guideline identifies a suitable position of a boundary pin within a cell.

At least a portion of the disclosed method can be embodied in the form of methods and apparatus for practicing those methods. At least a portion of the disclosed methods can be embodied in the form of program code embodied in tangible media, such as floppy diskettes, CD-ROMs, DVD-ROMs, Blu-ray disks, hard drives, or any other computer-readable storage medium, wherein, when the program code is loaded into and executed by a processor, the processor becomes an apparatus for practicing the method. Some or all of the disclosed methods also can be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the methods. When implemented on a general-purpose processor, the program code segments combine with the processor to provide a unique device that operates analogously to specific logic circuits.

Although the systems, methods, cells, layouts, and storage mediums have been described in terms of exemplary embodiments, they are not limited thereto. Rather, the appended claims should be construed broadly, to include other variants and embodiments of the systems, methods, cells, layouts, and storage mediums, which may be made by those skilled in the art without departing from the scope and range of equivalents of the systems, methods, cells, layouts, and storage mediums.

What is claimed is:

1. A method, comprising:
dividing a plurality of cells into groups such that each cell in a group includes a common attribute pertaining to a location of one or more boundary pins within the cell;
selecting one or more groups of cells that meet at least one selection guideline that identifies suitable positions for boundary pins within a cell;
storing the cells of the one or more groups of cells that meet the selection guideline in a non-transient computer readable storage medium to create a cell library,
wherein at least one photolithography mask is fabricated based on a final layout generated using at least one cell from the cell library, and
wherein at least one of the dividing, selecting, and storing is performed using a processor.

2. The method of claim 1, further comprising:
determining if an initial layout of cells includes a pin access problem, wherein the initial layout of cells includes an arrangement of two or more cells selected from the cell library;
if the initial layout includes at least one pin access problem, then adjusting at least one cell of the initial layout to produce a second layout that differs from the initial layout; and
storing one of the initial layout and the second layout as a final layout.

3. The method of claim 2, further comprising:
fabricating an integrated circuit using the at least one photolithography mask.

4. The method of claim 2, wherein adjusting at least one cell of the initial layout includes flipping at least one cell of the at least one cell.

5. The method of claim 2, wherein determining if the initial layout of cells includes a pin access problem includes determining if a marker of a first cell overlaps a marker of a second cell.

6. The method of claim 2, wherein, if the initial layout includes a pin access problem, the method includes analyzing the initial layout using dynamic programming to identify a solution to the pin access problem.

7. The method of claim 1, further comprising:
for each cell of the cells in the cell library, adding a marker identifying a location of a pin or the absence of a pin to at least one layer of the cell.

8. A system, comprising:
a non-transient computer readable storage medium; and
a processor in signal communication with the non-transient computer readable storage medium, the processor configured to:
create a first layout by accessing a cell library created by dividing a plurality of cells into groups such that each cell in a group includes a common attribute pertaining to a location of one or more boundary pins within the cell, and selecting
one or more groups of cells that meet at least one selection guideline that identifies suitable positions for boundary pins within a cell to create a cell library;
determine if the first layout of cells includes a pin access problem, wherein the first layout of cells includes an arrangement of at least two or more cells selected from the cell library; and
adjust at least one cell of the first layout to produce a second layout that differs from the first layout if the first layout includes at least one pin access problem, wherein the second layout is used to fabricate an integrated circuit.

9. The system of claim 8, wherein the processor is configured to:
  determine if a cell meets the selection guideline; and
  store the cell in the cell library in the non-transient computer readable storage medium if the cell meets the selection guideline.

10. The system of claim 9, wherein the processor is configured to
  for each cell that meets the selection guideline, add a marker identifying a location of a pin or the absence of a pin to at least one layer of the cell.

11. The system of claim 8, wherein the processor is configured to flip at least one cell when the processor adjusts at least one cell of the first layout.

12. The system of claim 8, wherein the processor is configured to determine if a marker of a first cell overlaps a marker of a second cell when determining if the first layout of cells includes a pin access problem.

13. The system of claim 8, wherein the selection guideline identifies a suitable position of a boundary pin within a cell.

14. A non-transient computer readable storage medium encoded with program code, wherein when the program code is executed by a processor, the processor performs a method, the method comprising:
  creating a first layout by accessing a cell library created by dividing a plurality of cells into groups such that each cell in a group includes a common attribute pertaining to a location of one or more boundary pins within the cell, and selecting one or more groups of cells that meet a selection guideline that identifies suitable positions for boundary pins within a cell;
  determining if the first layout of cells includes a pin access problem, wherein the first layout includes an arrangement of at least two cells selected from the cell library;
  if the first layout includes at least one pin access problem, then adjusting at least one cell of the first layout to produce a second layout that differs from the first layout; and
  storing one of the first layout and the second layout as a final layout,
  wherein the final layout is used to fabricate an integrated circuit.

15. The non-transient computer readable storage medium of claim 14, wherein the method includes comparing one or more cells against the selection guideline; and
  determining if the one or more cells meet the selection guideline.

16. The non-transient computer readable storage medium of claim 15, wherein the method includes:
  for each of the cells that meet the selection guideline, adding a marker to identify the presence of a pin in an area or the absence of a pin in an area to at least one layer of the cell.

17. The non-transient computer readable storage medium of claim 16, wherein the marker includes a portion that extends beyond a boundary of the cell to identify a location of a pin and includes a portion that extends inwardly from the boundary of the cell to identify the absence of a pin in an area.

18. The non-transient computer readable storage medium of claim 14, wherein adjusting at least one cell of the first layout includes flipping at least one cell of the at least one cell.

19. The non-transient computer readable storage medium of claim 14, wherein determining if a first layout of cells includes a pin access problem includes determining if a marker of a first cell overlaps a marker of a second cell.

20. The non-transient computer readable storage medium of claim 14, wherein the selection guideline identifies a suitable position of a boundary pin within a cell.

* * * * *